(12) United States Patent
Huang

(10) Patent No.: US 7,476,923 B2
(45) Date of Patent: Jan. 13, 2009

(54) MEMORY DEVICE AND FABRICATION THEREOF

(75) Inventor: Cheng-Chih Huang, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 490 days.

(21) Appl. No.: 11/297,237

(22) Filed: Dec. 7, 2005

(65) Prior Publication Data
US 2006/0134857 A1  Jun. 22, 2006

(30) Foreign Application Priority Data
Dec. 17, 2004 (TW) .............................. 93139377 A

(51) Int. Cl.
*H01L 29/94* (2006.01)
(52) U.S. Cl. ..................... 257/301; 257/302; 257/532
(58) Field of Classification Search ................. 257/301, 257/303, 304, 305, 532
See application file for complete search history.

(56) References Cited

U.S. PATENT DOCUMENTS

| | | | | |
|---|---|---|---|---|
| 5,216,266 A * | 6/1993 | Ozaki | .......................... | 257/302 |
| 6,406,970 B1 * | 6/2002 | Kudelka et al. | ............. | 438/386 |
| 6,727,541 B2 * | 4/2004 | Nishikawa | .................. | 257/301 |
| 6,873,003 B2 * | 3/2005 | Casarotto et al. | ............ | 257/315 |
| 7,015,526 B2 * | 3/2006 | Bonart | ........................ | 257/301 |
| 2007/0187752 A1 * | 8/2007 | Lin et al. | .................... | 257/330 |

* cited by examiner

*Primary Examiner*—Michael Trinh
(74) *Attorney, Agent, or Firm*—Quintero Law Office

(57) ABSTRACT

A semiconductor memory device. A trench capacitor disposed at a lower portion of a trench in a substrate, in which the trench capacitor comprises a filling electrode layer and a collar dielectric layer surrounding the filling electrode layer. The top of the collar dielectric layer is lower than top surface level of the filling electrode layer. A vertical transistor is disposed at the upper portion of the trench, comprising a doped region disposed in a portion of the trench adjacent to the trench. A buried conductive layer interposed between the vertical transistor and the trench capacitor, wherein the cross section of the buried conductive layer is H shaped. The trench capacitor and the doping region of vertical transistor are electrically connected through the H shaped buried conductive layer.

9 Claims, 10 Drawing Sheets

MEMORY DEVICE AND FABRICATION THEREOF

BACKGROUND

The invention relates to a semiconductor device and fabrication thereof, and in particular to a memory device and fabrication thereof.

With the wide application of integrated circuits (ICs), several kinds of semiconductor devices with higher efficiency and lower cost are produced based on different objectives. The dynamic random access memory (DRAM) is an example of an important semiconductor device. Basically, a DRAM is an integrated circuit that stores data in binary form (e.g., "1" or "0") in a large number of cells.

Most DRAMs have one transistor and one capacitor in one DRAM cell. The memory capacity of the DRAM has reached 256 megabits. Therefore, under increasing integration the size of the memory cell and the transistor must shrink to yield DRAM with higher memory capacity and higher processing speed. A 3-D capacitor structure can itself reduce the occupied area in the semiconductor substrate, thus, the 3-D capacitor, such as a deep trench capacitor, is applied to the fabrication of the DRAM of 64 megabits and above. Traditional DRAM with a plane transistor covers larger areas of the semiconductor substrate and cannot satisfy the demand for high integration. Therefore, a vertical transistor which can save space is a trend in memory cell fabrication.

In general, when forming a memory device with vertical transistors and trench capacitors, formation of filling electrode (top electrode) is fabricated by deposition and etching. The etching back typically further comprises an over etching to completely remove the etched films. During the over etching step, divots may be formed on the filling electrode, and tip is formed on the interface between the filling electrode and a buried conductive layer to generate point discharge, thus, performance of the memory device is affected. In addition, the buried conductive layer is typically formed by filling a polysilicon layer into the region between the filling electrode and sidewalls of the trench. This method, however, is likely to generate seams. Since the buried conductive layer is a connection between the vertical transistor and the trench capacitor, seams in the buried conductive layer affect performance and reliability of the memory device.

SUMMARY

These and other problems are generally solved or circumvented, and technical advantages are generally achieved, by preferred illustrative embodiments of the present invention, which provide semiconductor memory device and fabrication thereof.

An embodiment of the invention provides a method for forming a memory device. A substrate comprising a trench is provided, wherein a trench capacitor is disposed in a lower portion of the trench. The trench capacitor comprises a filling electrode layer and a collar dielectric layer surrounding the filling electrode layer. The top of the collar dielectric layer is lower than the top surface level the filling electrode layer. A barrier layer is conformally formed on the collar dielectric layer, the filling electrode layer and sidewalls of the trench. A conductive layer is conformally deposited on the barrier layer. A buried strap definition layer is formed on the conductive layer over the filling electrode layer. A portion of the conductive layer over the buried strap definition layer is removed using the buried strap definition layer as an etching stop.

Another embodiment of the invention provides a semiconductor memory device. A trench capacitor is disposed at lower portion of a trench in a substrate, in which the trench capacitor comprises a filling electrode layer and a collar dielectric layer surrounding the filling electrode layer. Top of the collar dielectric layer is lower than top surface level of the filling electrode layer. A vertical transistor is disposed at upper portion of the trench, comprising a doped region disposed in a portion of the trench adjacent to the trench. A buried conductive layer is interposed between the vertical transistor and the trench capacitor, wherein the cross section of the buried conductive layer is H shaped. The trench capacitor and the doped region of the vertical transistor are electrically connected through the H shaped buried conductive layer.

DESCRIPTION OF THE DRAWINGS

The invention can be more fully understood by reading the subsequent detailed description and examples with references made to the accompanying drawings, wherein.

DETAILED DESCRIPTION

The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

FIGS. 1a~1d illustrate a method known to the inventor of forming a memory device comprising a vertical transistor and a trench capacitor. This is not prior art for the purpose of determining the patentability of the present invention. This merely shows a problem found by the inventors.

Figure 1A:
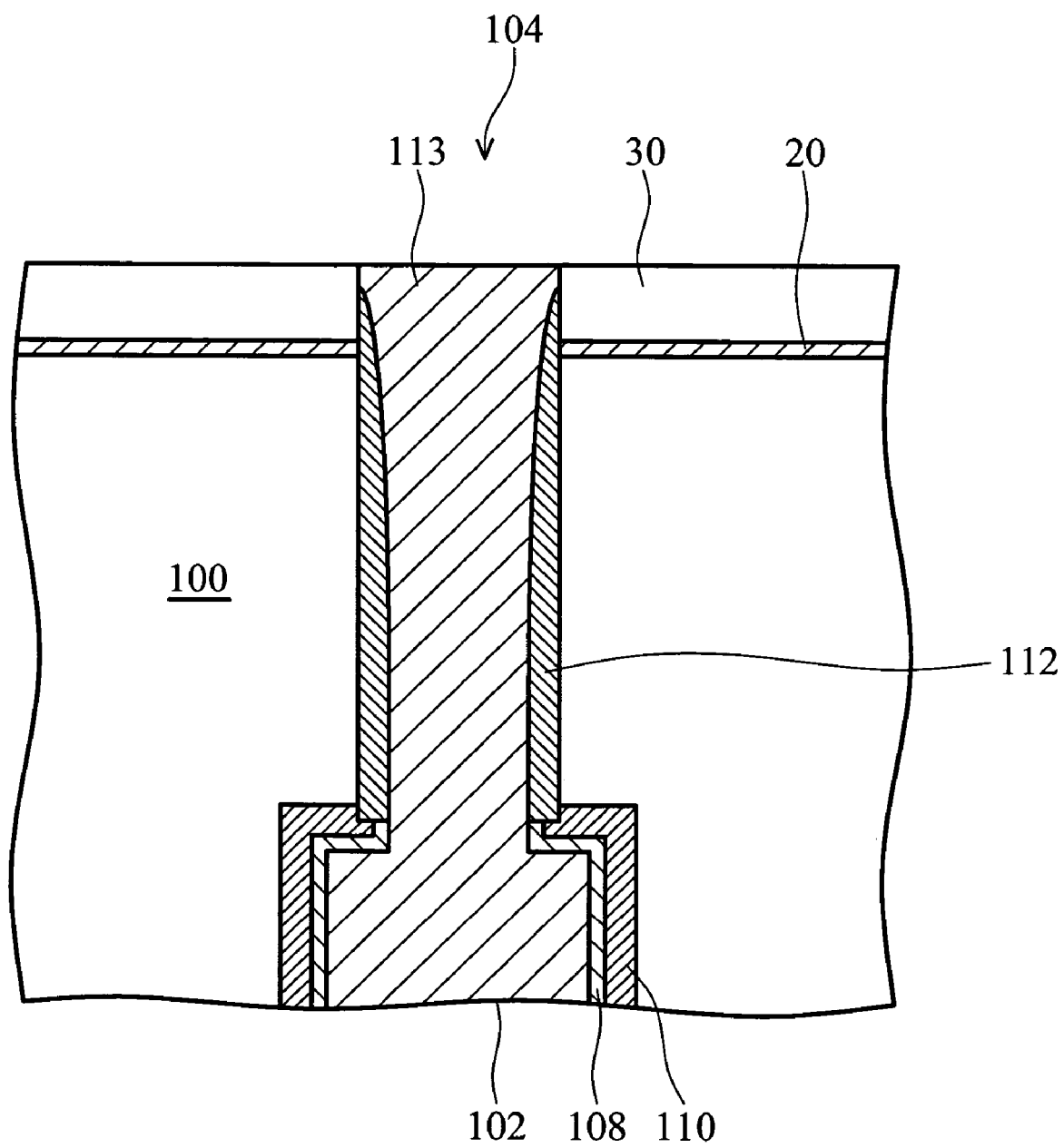
FIGS. 1a~1d illustrate a method known to the inventor of forming a memory device comprising a vertical transistor and a trench capacitor.

As shown in FIG. 1a, a pad oxide layer 20 and a pad nitride layer 30 are formed on a silicon substrate 100, and then patterned by conventional lithography and etching to form an opening. The substrate 100 is etched using patterned pad oxide and pad nitride layers 20 and 30 as a hard mask to form a plurality of trenches (only one trench is expressed for simplicity). Next, a bottom electrode 110 is formed in a portion of the substrate 100 adjacent to the lower portion of the trench 104 by diffusion. A capacitor dielectric layer 108 is formed on sidewalls of lower portion of the trench 104, and a collar dielectric layer 112 is formed on sidewalls of upper portion of the trench 104. A polysilicon conductive layer 102 is then filled into the trench 104 to act as a top electrode 113 (filling electrode layer) of a trench capacitor.

Figure 1B:
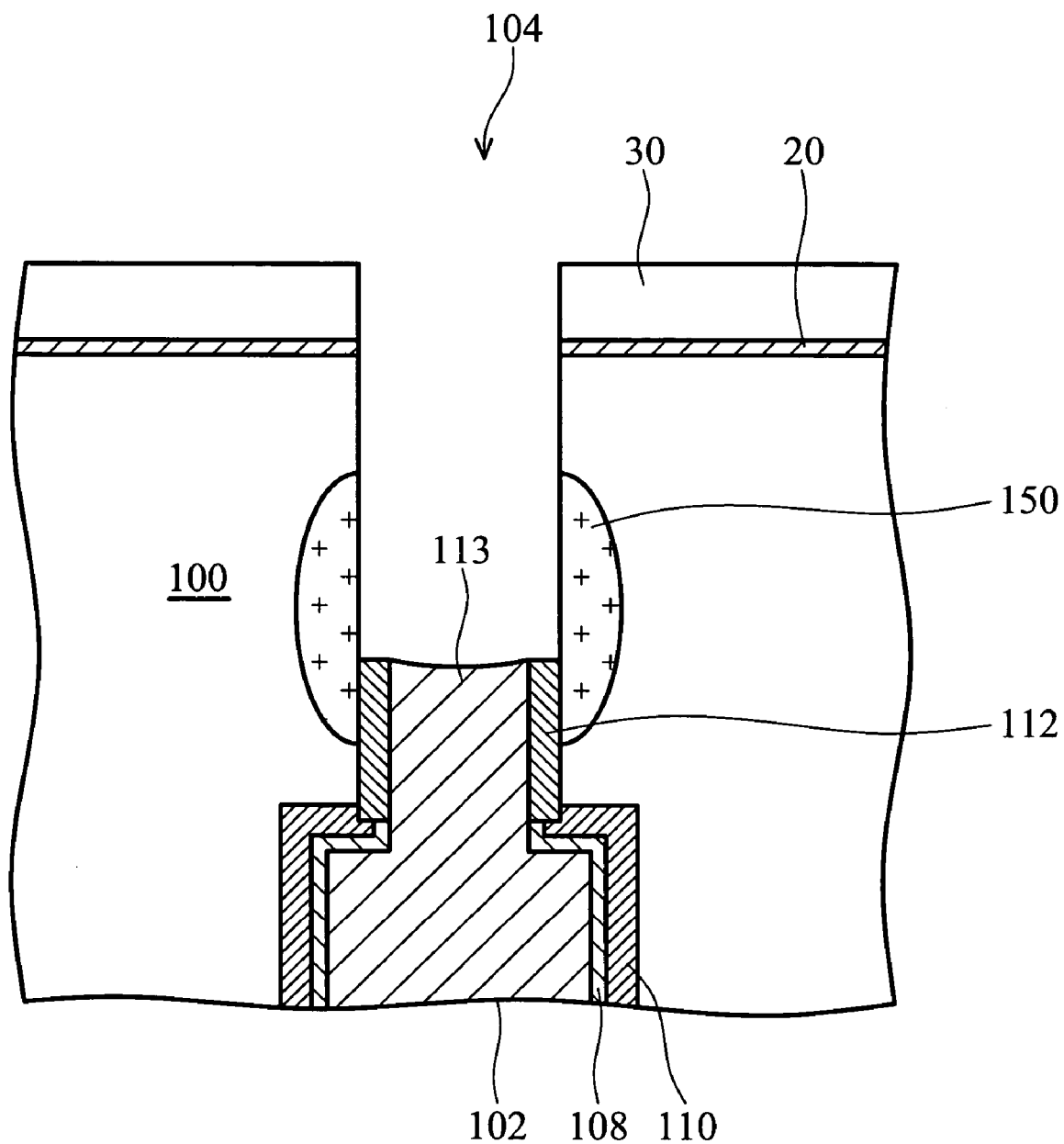

As shown in FIG. 1b, the filling electrode layer 113 and the collar dielectric layer 112 are etched back to a predetermined depth lower than the substrate 100 surface level. Next, a doped silicon layer (not shown), such as arsenic silicate glass (ASG), is formed on sidewalls of the trench 104, overlying the collar dielectric layer 112. A doping region 150 is formed in the substrate by a thermal process to act as a source/drain of a vertical transistor. Thereafter, the doped silicon layer is removed.

Figure 1C:
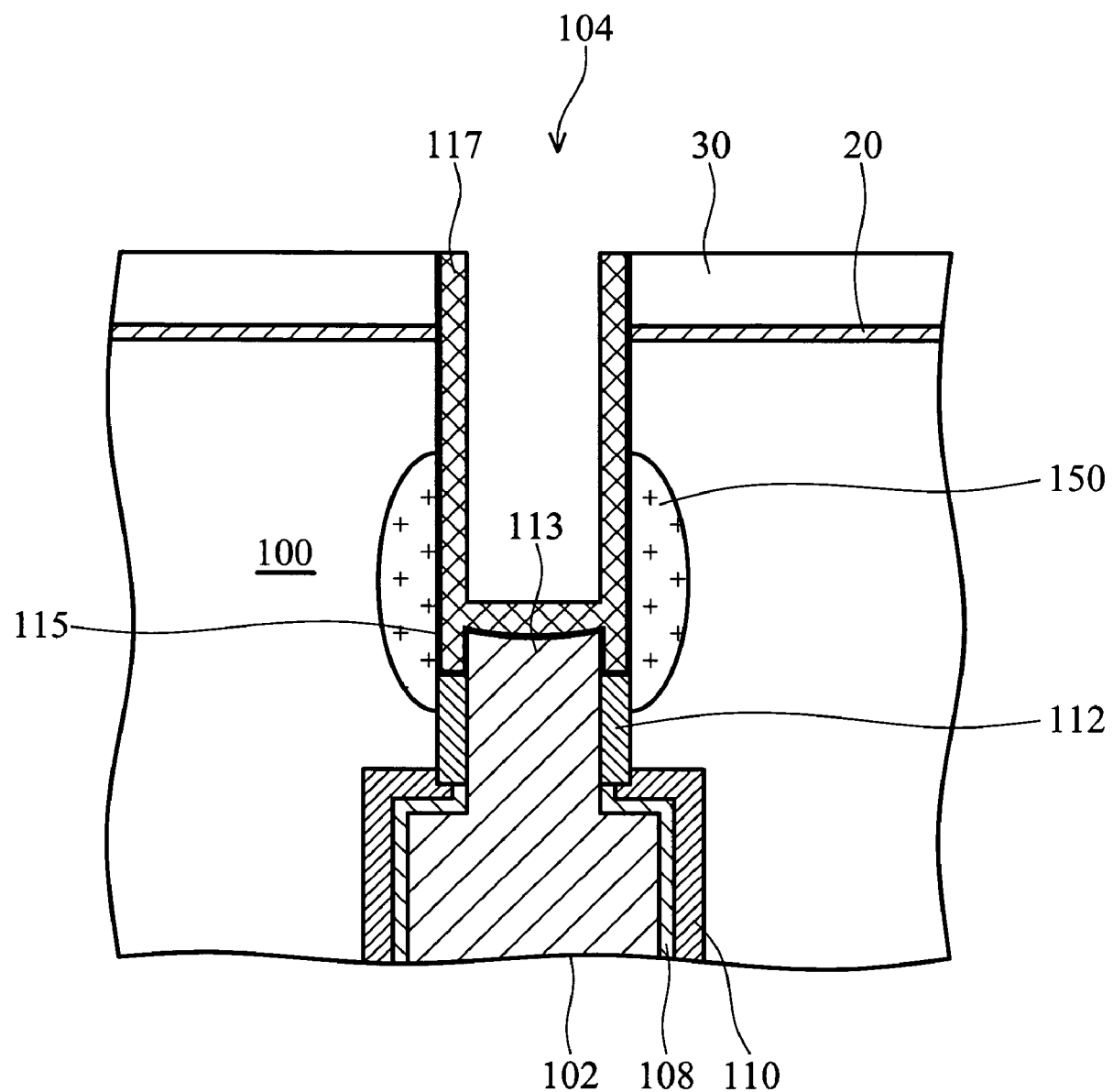

As shown in FIG. 1c, the collar dielectric layer 112 surrounding the filling electrode layer 113 is etched by selective etching to achieve a surface lower than the filling electrode layer 113 surface level, forming a gap between the filling electrode layer 113 and sidewalls of the trench 104.

Figure 1D:
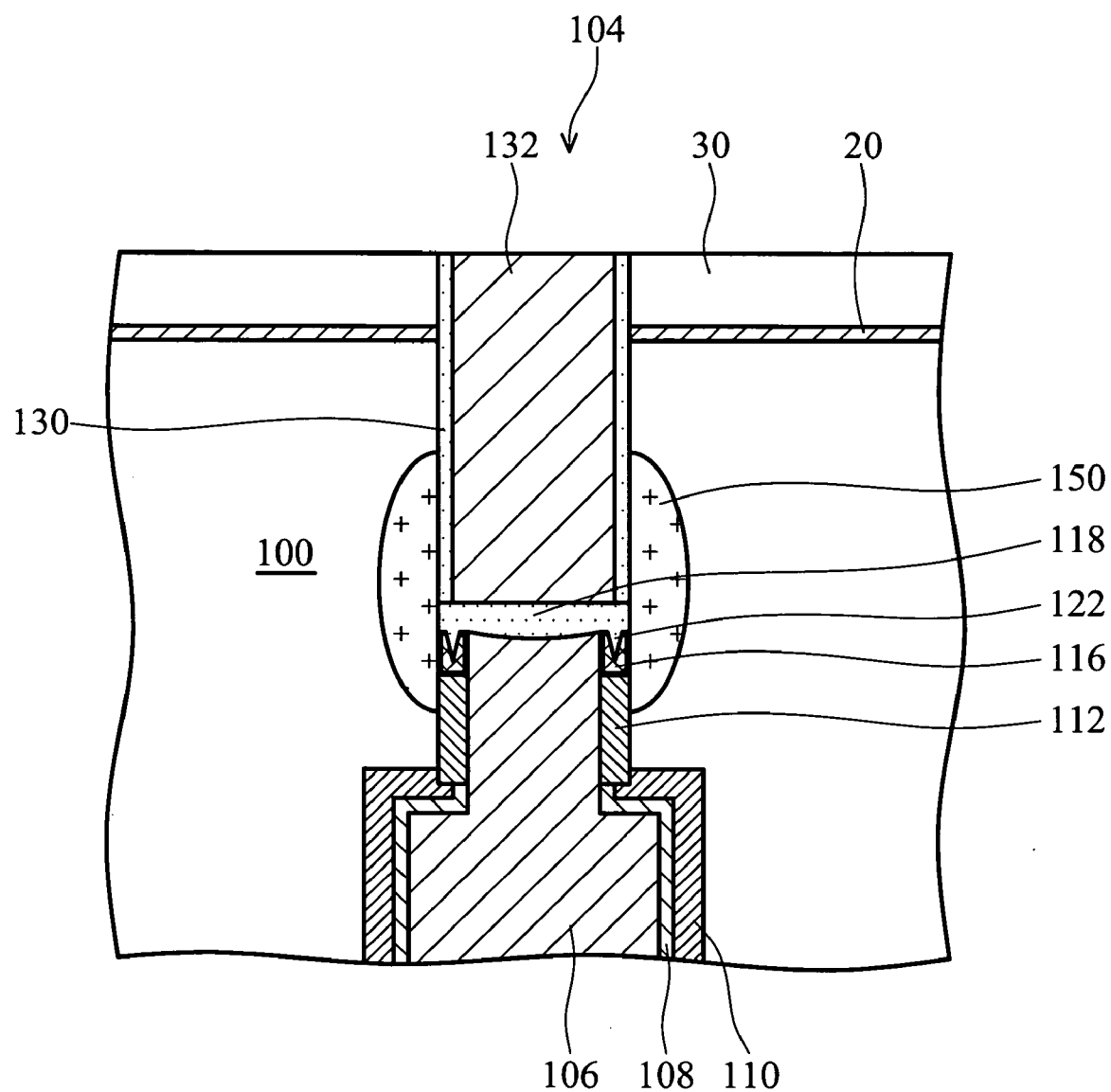

As shown in FIG. 1d, the conductive layer is etched back to form a buried conductive layer 116 between the conductive layer 117 and sidewalls of the trench 104. Next, a top insulating layer 118 is formed on the filling electrode layer 113. A gate dielectric layer 130 is formed on sidewalls of the trench 104, overlying the top insulating layer 118. A gate conductive layer 132 is filled into the trench 104, overlying the top insulating layer 118. Consequently, a trench capacitor comprising the top electrode 106 (filling electrode layer), the capacitor dielectric layer 108 and the bottom electrode 110 is complete. The gate conductive layer 132 and the gate dielectric layer 130 are elements of a vertical transistor. The buried conductive layer 116 between the filling electrode layer 106 and sidewalls of the trench 104, and overlying the collar dielectric layer 112 serves to connect the trench capacitor and the vertical transistor.

As shown in FIG. 1d, due to small size of the gap between the filling electrode layer 106 and sidewalls of the trench 104, seam is likely to be generated during filling of the gap. The buried conductive layer 116 is for connecting the trench capacitor and the vertical transistor, and connection fails between the trench capacitor and the vertical transistor are likely to occur when the buried conductive layer 116 comprises seams 122.

Formation of the filling electrode (top electrode) is accomplished by deposition and etching back, in which etching back typically further comprises an over etching step to completely remove the remaining film. Due to the over etching step, divots is likely to be formed on the filling electrode 106, and tip 120 is formed on the interface between filling electrode layer 106 and a buried conductive layer 122 to generate point discharge, affecting performance of the memory device.

Figure 2A:
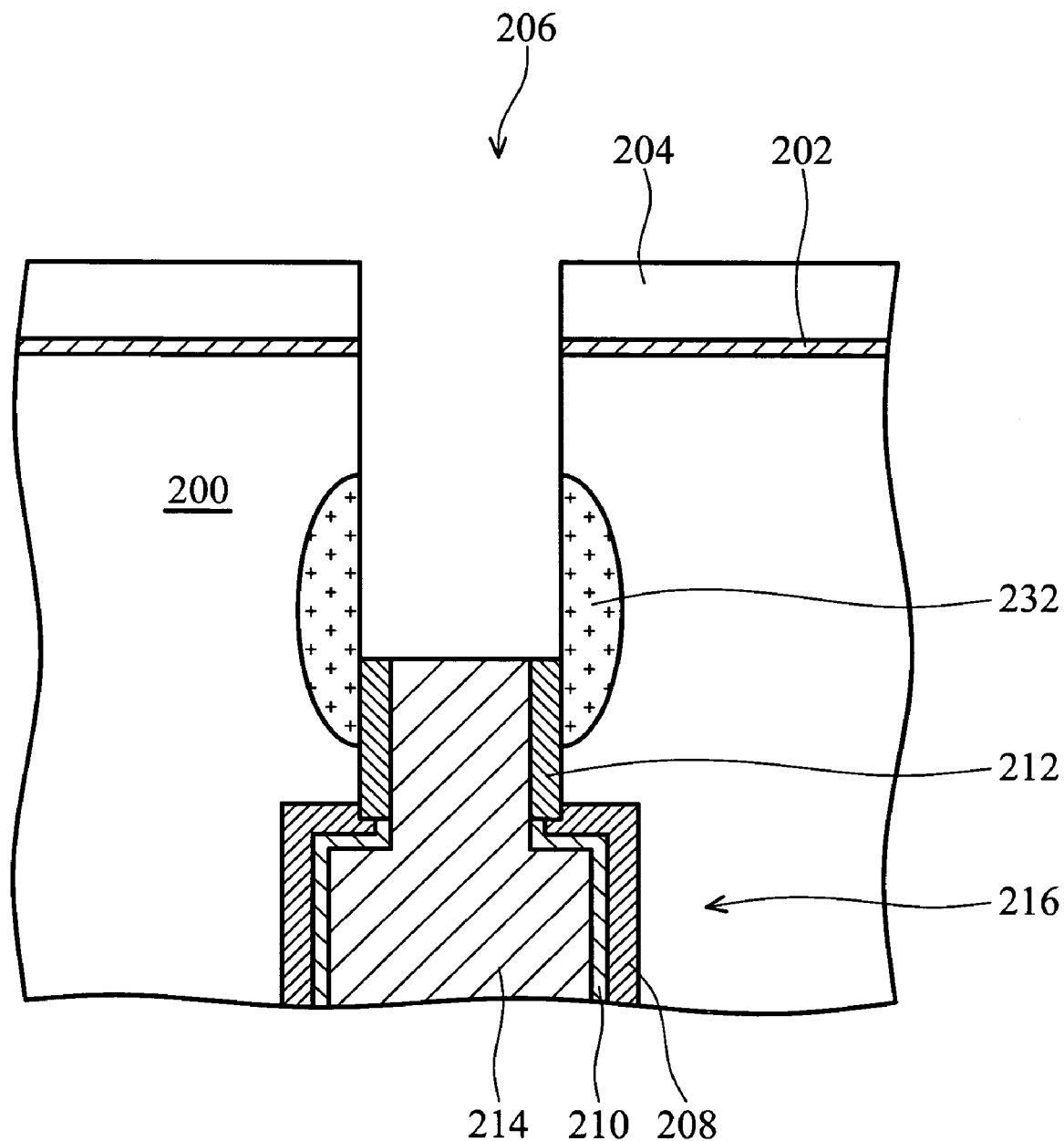
FIGS. 2a~2f are intermediate cross sections of a memory device of an embodiment of the invention.

FIGS. 2a~2f are intermediate cross sections of a memory device of an embodiment of the invention. Referring to FIG. 2a, a pad oxide layer 202 and a pad nitride layer 204 are formed on a substrate 200, such as a silicon substrate, and then patterned by conventional lithography and etching to form an opening. The substrate 200 is etched using patterned pad oxide and pad nitride layers 202 and 204 as a hard mask to form a plurality of trenches (only one trench 206 is expressed for simplifying). Next, a bottom electrode 208 is formed in a portion of the substrate 200 adjacent to the lower portion of the trench 206 by thermal diffusion. A capacitor dielectric layer 210, such as a stack layer of oxide-nitride-oxide, is formed on sidewalls of lower portion of the trench 206. A collar dielectric layer 212 is formed on sidewalls of upper portion of the trench 206.

A conductive material, such as polysilicon, is then filled into the trench 206 to form a filling electrode layer 214 (top electrode) in the trench 206. Both the collar dielectric layer 212 and the filling electrode layer 214 are etched back to a predetermined depth lower than the substrate surface level. Consequently, a trench capacitor 216 comprising the buried electrode layer 208, the capacitor dielectric layer 210 and the filling electrode layer 214 is complete. The collar dielectric layer, such as silicon oxide, can prevent leakage of charges accumulated from the trench capacitor 216 to the substrate or a vertical transistor formed in subsequent process. Next, a doped silicon layer (not shown), such as arsenic silicate glass (ASG), is formed on sidewalls of the trench 206, overlying the collar dielectric layer 212. A doping region 232 is formed in the substrate 200 by a thermal process to act as a source/drain of a vertical transistor. Thereafter, the doped silicon layer is removed.

Figure 2B:
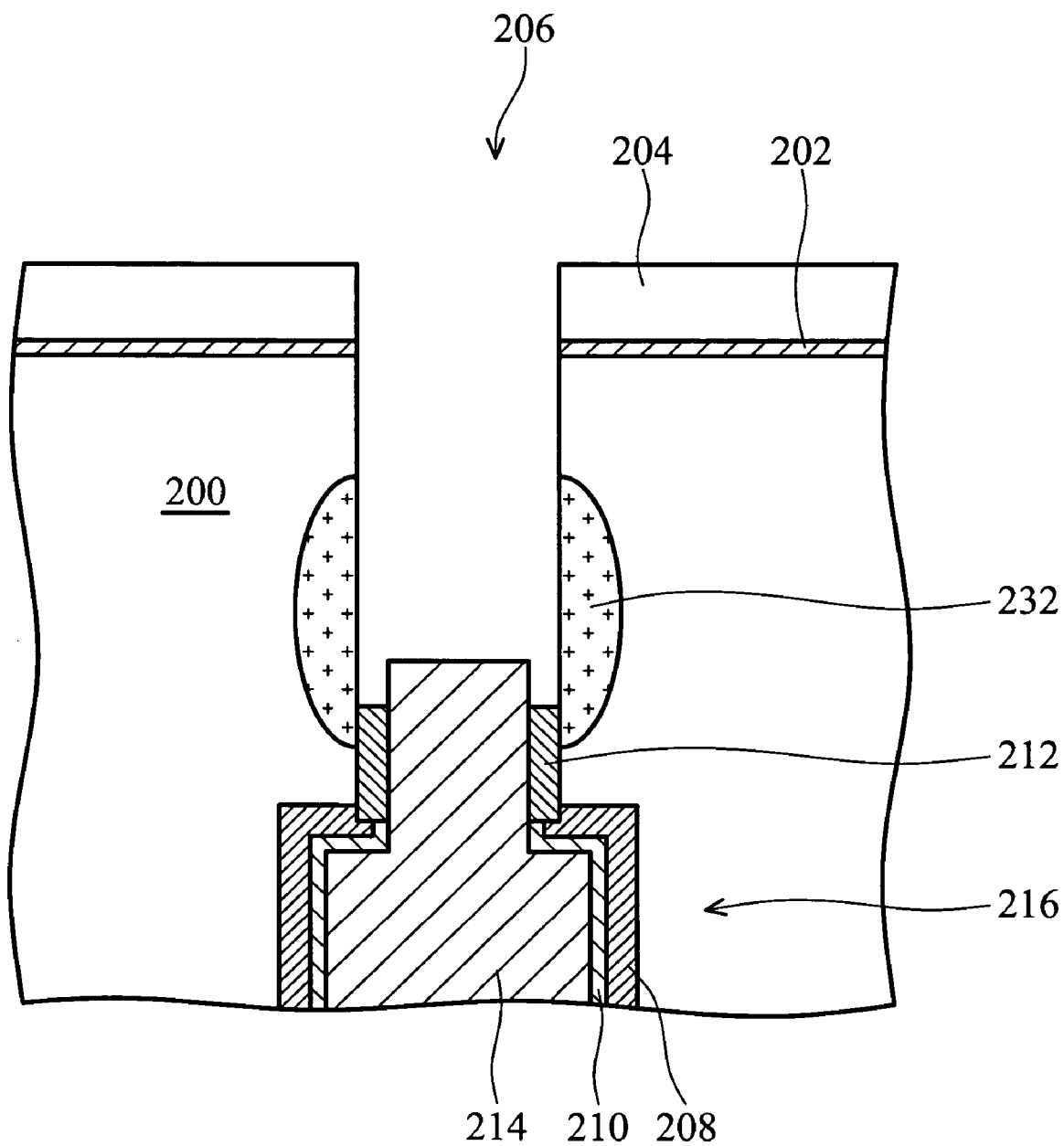
Figure 2C:
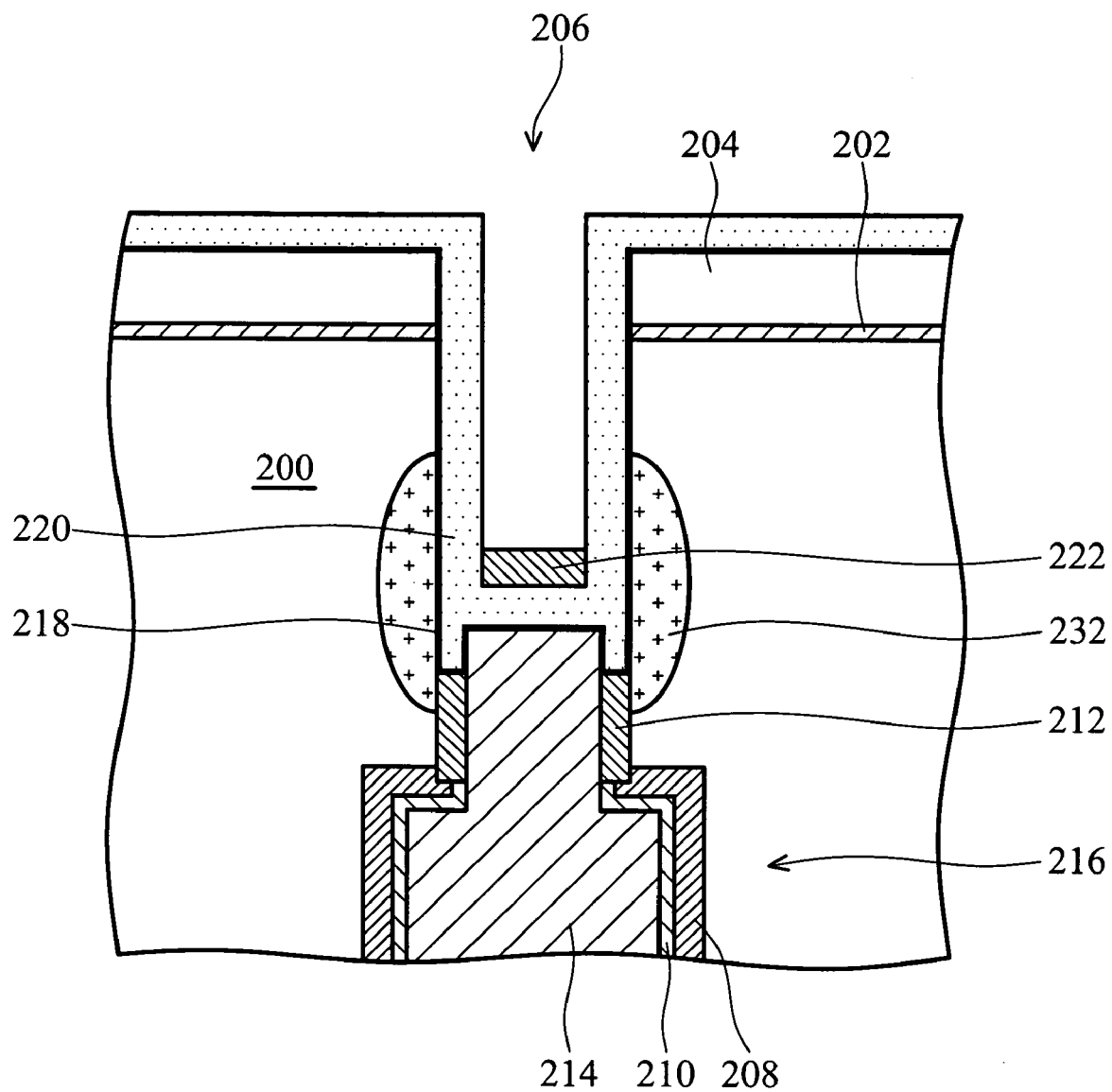

As shown in FIG. 2b, the collar dielectric layer 212 surrounding the filling electrode layer 214 is etched by selective etching to be lower than top surface level of the filling electrode layer 214. The selective etching can be wet etching, such as immersion in HF, or dry etching, for example using CH4 or CHF3 as a main etchant. Next, as shown in FIG. 2c, a barrier layer 218, such as silicon nitride, is deposited on the filling electrode layer 214, the collar dielectric layer 212 and sidewalls of the trench 206. A conductive layer 220, preferably about 100 Å~500 Å thick, is conformally deposited on the barrier layer 218, filling the gap between the filling electrode layer 214 and sidewalls of the trench 206.

A buried strap definition layer 222 is formed on the conductive layer 214 by deposition and etching back. In a preferred embodiment of the invention, the buried strap definition layer 222 fills a portion of the trench 206 covered with the conductive layer 214 overlying the filling electrode layer 214. Preferably, the buried strap definition layer 222 comprises silicon oxide, and is formed by the following steps. A buried strap definition layer is conformably deposited on the conductive layer 220 and fills the trench 206. The deposition mentioned herein preferably is a technique capable of forming the buried strap definition layer with thicker bottom and thinner sidewalls. For example, the deposition preferably is high density plasma deposition, HDP.

Next, an isotropic etching, such as immersion in HF, is achieved to remove a portion of the buried strap definition layer on the sidewalls of trench 206. Due to the thick bottom and thinner sidewalls of the buried strap definition layer, a portion of the buried strap definition layer 222 adjacent to the bottom of the conductive layer remains.

Figure 2D:
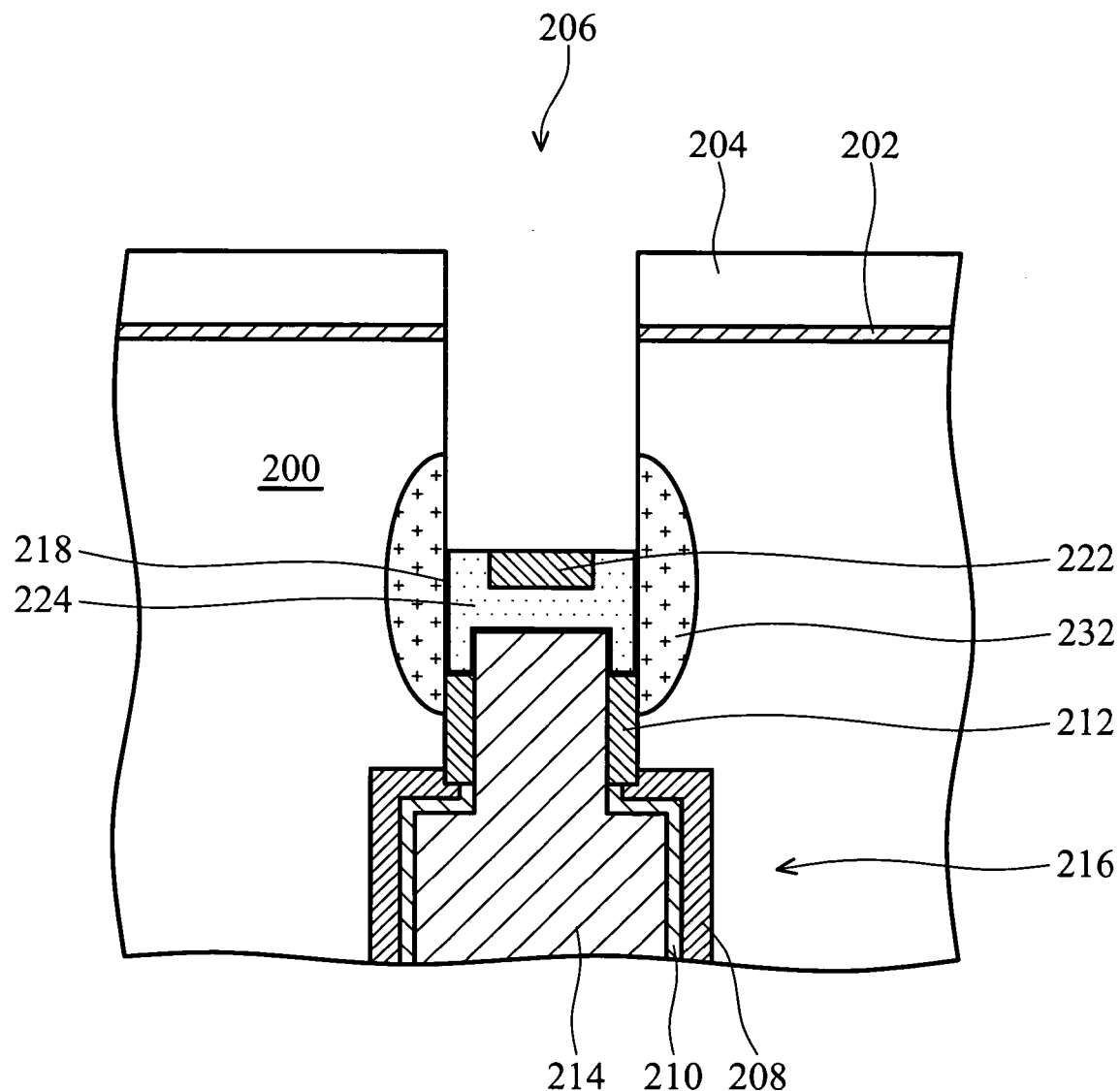
Figure 2E:
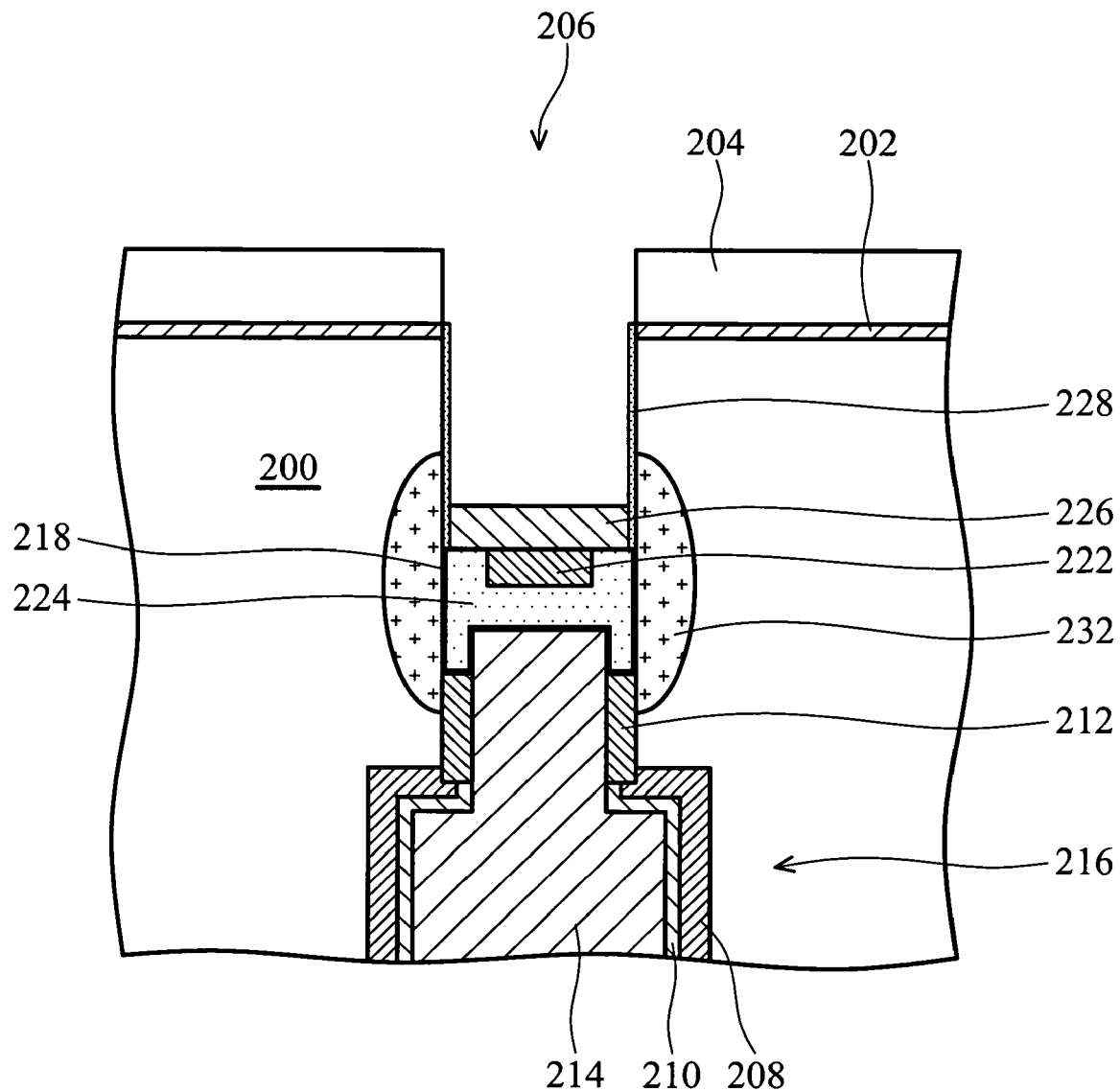
Figure 2F:
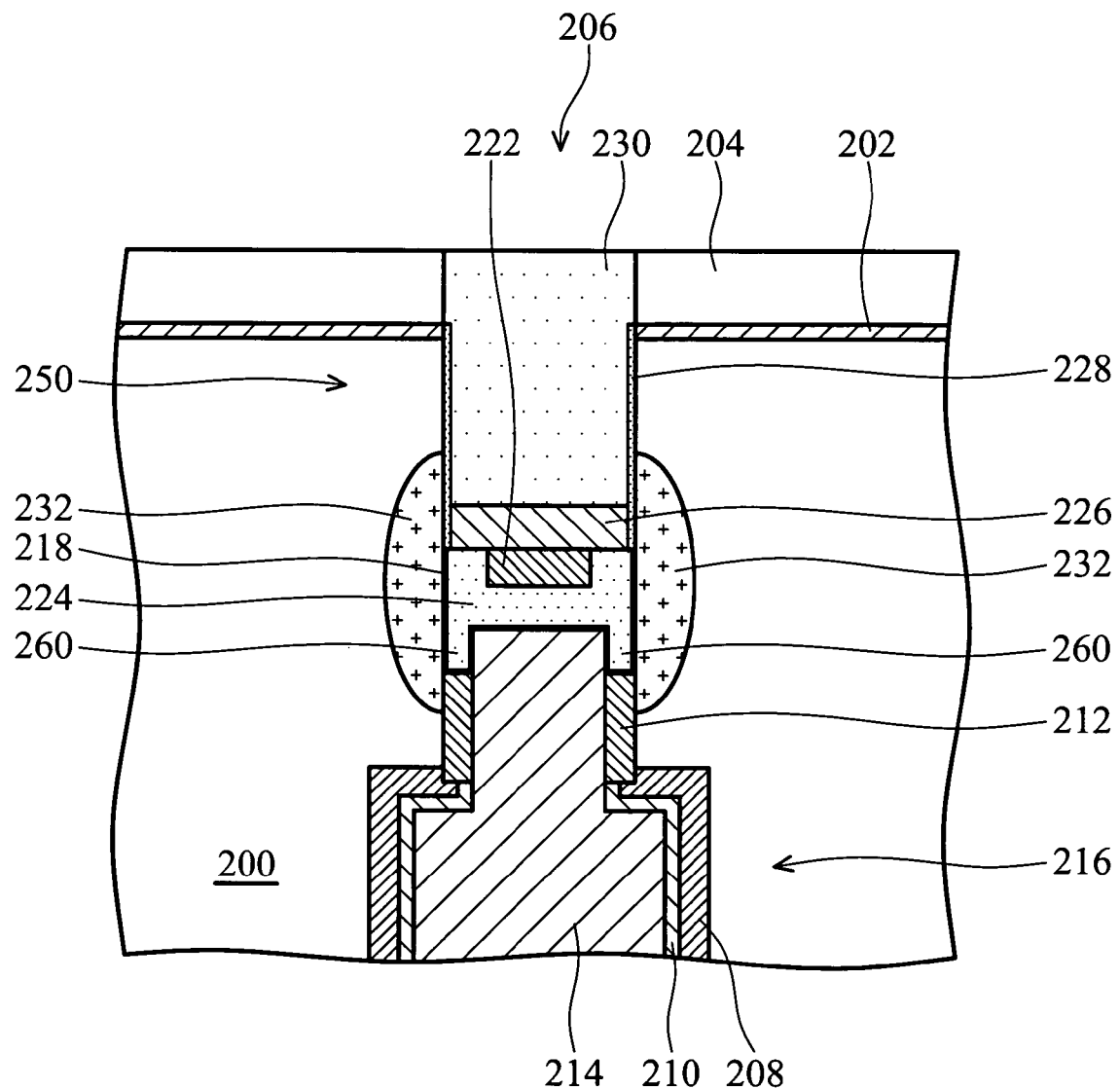

As shown in FIG. 2d, an isotropic etching, such as immersion in HF and HNO3 or dry etching using Cl containing gas as an ethant, is performed using the buried strap definition layer 222 as an etching stop to remove a portion of the conductive layer 224 overlying the buried strap definition layer 222. Preferably, the etched conductive layer 222 is substantially coplanar with the buried strap definition layer 222, forming an H shaped buried conductive layer 224 in cross section view. As shown in FIG. 2e, a top insulating layer 226, such as silicon oxide, is formed on the buried strap definition layer 222 and the conductive layer 224 by deposition and etching back, to isolate the trench capacitor and a vertical transistor, formed in subsequent steps. Next, a gate dielectric layer 228, such as silicon oxide formed by thermal process, is formed on the sidewalls of the trench 206 overlying the top insulating layer 226. As shown in FIG. 2f, a gate conductive layer 230, such as polysilicon, is formed in the trench 206, overlying the top insulating layer 226, to act as a gate controlling the vertical transistor 250.

As shown in FIG. 2f, a cross section of a memory device comprising a vertical transistor and a capacitor, a substrate 200 comprises a trench 206, and a trench capacitor 216 is disposed in lower portion of the trench 206. A vertical transistor 250 is disposed in an upper portion of the trench 206. An H shaped buried conductive layer 224 is interposed between the vertical transistor 216 and the capacitor 250.

The trench capacitor 216 comprises filling electrode layer 214 (top electrode), a collar dielectric layer 212 surrounding the filling electrode layer 214, capacitor dielectric layer 210 on sidewalls of the lower portion of the trench 206, and a buried electrode layer 208 disposed in a portion of the substrate 200 adjacent to the lower portion of the trench 206. The vertical transistor 250 comprises a gate conductive layer 230, a gate dielectric layer 228 on sidewalls of upper portion of the trench 206 and a source/drain region 232 disposed in the substrate 200. The H shaped buried conductive layer 224 is interposed between the vertical transistor 250 and the trench capacitor 216, filling a gap between the filling electrode layer 214 and sidewalls of the trench 206. A buried strap definition layer 222 is disposed on the H shaped buried conductive layer 224 and surrounded by top corners thereof. Additionally, the H shaped buried conductive layer 224 comprises a cavity filled by the buried strap definition layer 222. The vertical transistor 250 is isolated from the trench capacitor 216 by a top insulating layer 226, wherein both are electrically connected through top corners of H shaped buried conductive layer 224.

The trench capacitor 216 of the memory device of a preferred embodiment of the invention is electrically connected to the doped region 232 of the vertical transistor 250 through the H shaped buried conductive layer 224. Consequently, when seams are generated in the ring shaped region 260 between the filling electrode layer 214 and the collar dielectric layer 212, affection of connection between the vertical transistor and the trench capacitor is reduced. In addition, due to there not being any direct connection between the filling electrode layer 214 and the vertical transistor 250, point discharge caused by indentation of the over-etched filling electrode layer 214 is eliminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprises:
   a substrate, comprising a trench;
   a trench capacitor disposed at lower portion of the trench, comprises a filling electrode layer and a collar dielectric layer surrounding the filling electrode layer, wherein top of the collar dielectric layer is lower than top surface level of the filling electrode layer;
   a vertical transistor disposed at upper portion of the trench, wherein the vertical transistor comprises a doped region disposed in a portion of the trench adjacent to the trench;
   a buried conductive layer interposed between the vertical transistor and the trench capacitor, wherein the cross section of the buried conductive layer is H shaped; and
   wherein the trench capacitor and the doping region of vertical transistor are electrically connected through the H shaped buried conductive layer.

2. The semiconductor memory device as claimed in claim 1, wherein the trench capacitor further comprises a capacitor dielectric layer disposed on sidewalls of lower portion of the trench, and a buried electrode layer disposed in a portion of the substrate adjacent to the trench.

3. The semiconductor memory device as claimed in claim 1, wherein the vertical transistor further comprises a gate conductive layer disposed in upper portion of the trench, and a gate dielectric layer disposed on sidewalls of upper portion of the trench.

4. The semiconductor memory device as claimed in claim 1, wherein the buried conductive layer fills a region between the filling electrode layer and sidewalls of the trench.

5. The semiconductor memory device as claimed in claim 1, wherein the buried conductive layer comprises a cavity, and a buried strap definition layer is disposed in the cavity.

6. The semiconductor memory device as claimed in claim 5, wherein the buried strap definition layer comprises silicon oxide.

7. The semiconductor memory device as claimed in claim 1, further comprises a top insulating layer disposed overlying the buried conductive layer, wherein the trench capacitor is isolated from the vertical transistor by the top insulating layer.

8. The semiconductor memory device as claimed in claim 1, wherein the buried conductive layer comprises polysilicon.

9. The semiconductor memory device as claimed in claim 1, wherein the collar dielectric layer comprises silicon oxide.

* * * * *